(12) United States Patent  (10) Patent No.: US 9,397,710 B2
Tsutsui                    (45) Date of Patent:     Jul. 19, 2016

(54) POWER AMPLIFIER MODULE (71) Applicant: Murata Manufacturing Co., Ltd., Kyoto (JP)

(72) Inventor: Takayuki Tsutsui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 14/620,968

(22) Filed: Feb. 12, 2015

(65) Prior Publication Data
US 2015/0249433 A1   Sep. 3, 2015

(30) Foreign Application Priority Data
Feb. 28, 2014 (JP) .................. 2014-038745

(51) Int. Cl.
H04B 1/38    (2015.01)
H04B 1/04    (2006.01)
H03F 3/24    (2006.01)
H04B 1/00    (2006.01)
H03F 1/02    (2006.01)
(Continued)

(52) U.S. Cl.
CPC ................ *H04B 1/04* (2013.01); *H03F 1/0277* (2013.01); *H03F 1/56* (2013.01); *H03F 3/191* (2013.01); *H03F 3/195* (2013.01); *H03F 3/211* (2013.01); *H03F 3/245* (2013.01); *H03F 3/68* (2013.01); *H03F 3/72* (2013.01); *H04B 1/0053* (2013.01); *H03F 2200/111* (2013.01); *H03F 2200/222* (2013.01); *H03F 2200/27* (2013.01); *H03F 2200/318* (2013.01); *H03F 2200/387* (2013.01); *H03F 2200/429* (2013.01); *H03F 2200/451* (2013.01); *H03F 2203/21142* (2013.01); *H03F 2203/7206* (2013.01); *H03F 2203/7209* (2013.01); *H03F 2203/7236* (2013.01); *H04B 2001/0408* (2013.01)

(58) Field of Classification Search
CPC ........... H03F 1/48; H03F 3/193; H03F 3/245; H04B 1/0053; H04B 1/04
USPC .......... 455/73, 127.3, 194.2, 144, 253.2, 311, 455/341; 330/51
See application file for complete search history.

(56) References Cited

U.S. PATENT DOCUMENTS 7,589,589 B2 *  9/2009  Kusunoki .............. H03F 1/0277
                                                      330/124 R
8,008,970 B1 *  8/2011  Homol ...................... H03F 3/72
                                                      330/296

(Continued)

FOREIGN PATENT DOCUMENTS

JP      2011-166354 A     8/2011

*Primary Examiner* — Md Talukder
(74) *Attorney, Agent, or Firm* — Pearne & Gordon LLP (57) ABSTRACT A power amplifier module includes a first signal input terminal to which a first radio frequency signal of a first frequency band is input; a second signal input terminal to which a second radio frequency signal of a second frequency band is input; first, second, and third power amplifiers; and a bias control circuit. The first signal input terminal and an input terminal of the first power amplifier are electrically connected to each other, the second signal input terminal and an input terminal of the second power amplifier are electrically connected to each other, output terminals of the first and second power amplifiers and an input terminal of the third power amplifier are electrically connected to each other, and the bias control circuit controls supplying a bias current to one of the first and second power amplifiers depending on a selected frequency band.

14 Claims, 8 Drawing Sheets (51) Int. Cl.
*H03F 1/56* (2006.01)
*H03F 3/195* (2006.01)
*H03F 3/21* (2006.01)
*H03F 3/68* (2006.01)
*H03F 3/72* (2006.01)
*H03F 3/191* (2006.01)

(56) References Cited

U.S. PATENT DOCUMENTS

| | | | | |
|---|---|---|---|---|
| 2003/0201827 A1* | 10/2003 | Ohnishi | | H01L 23/66 330/133 |
| 2003/0222709 A1* | 12/2003 | Kim | | H03F 1/0277 330/51 |
| 2004/0090267 A1* | 5/2004 | Nagamori | | H03F 1/301 330/133 |
| 2007/0298736 A1* | 12/2007 | Fujioka | | H03F 1/0266 455/127.3 |
| 2010/0301944 A1* | 12/2010 | Yamamoto | | H01L 27/0605 330/277 |
| 2011/0037516 A1* | 2/2011 | Nejati | | H03F 1/565 330/124 R |
| 2011/0230149 A1* | 9/2011 | Kuriyama | | H03F 1/0205 455/127.1 |
| 2012/0146731 A1* | 6/2012 | Khesbak | | H03F 1/0222 330/295 |
| 2012/0154054 A1* | 6/2012 | Kaczman | | H03F 1/083 330/295 |
| 2012/0293257 A1* | 11/2012 | Watanabe | | H03F 1/0277 330/251 |
| 2013/0265111 A1* | 10/2013 | Ota | | H03F 1/0277 330/286 |
| 2013/0293308 A1* | 11/2013 | Gupta | | H03F 1/3229 330/293 |
| 2014/0312977 A1* | 10/2014 | Kaczman | | H03F 1/0222 330/295 |
| 2015/0249433 A1* | 9/2015 | Tsutsui | | H03F 3/245 455/90.2 |

* cited by examiner

POWER AMPLIFIER MODULE

BACKGROUND OF THE INVENTION

1. Field of the Invention

The present invention relates to a power amplifier module.

2. Background Art

In recent years, mobile communication equipment capable of coping with multiple frequency bands has been used. In such mobile communication equipment capable of coping with multiple bands, a power amplifier module for amplifying power of a signal which is transmitted to a base station needs to correspond to multiple bands. For example, Patent Document 1 discloses a power amplifier module including plural input terminals corresponding to radio frequency (RF) signals of multiple bands.

CITATION LIST

Patent Document

[Patent Document 1] JP 2011-166354 A

SUMMARY OF THE INVENTION

In the power amplifier module disclosed in Patent Document 1, a switch for selectively connecting one of plural input terminals to a power amplifier is used to input an RF signal of one band selected from plural bands to the power amplifier. In general, a field effect transistor (FET) is used as the switch. Accordingly, when a power amplifier is constituted by a bipolar transistor such as a heterojunction bipolar transistor (HBT), processes of manufacturing a power amplifier module is complicated and an increase in costs is caused.

The present invention is made in consideration of the aforementioned circumstances and an object thereof is to reduce manufacturing costs of a power amplifier module capable of coping with multiple frequency bands.

According to an aspect of the present invention, there is provided a power amplifier module including: a first signal input terminal to which a first radio frequency signal of a first frequency band is input; a second signal input terminal to which a second radio frequency signal of a second frequency band is input; first, second, and third power amplifiers; and a bias control circuit, wherein the first signal input terminal and an input terminal of the first power amplifier are electrically connected to each other, the second signal input terminal and an input terminal of the second power amplifier are electrically connected to each other, an output terminal of the first power amplifier is electrically connected to an output terminal of the second power amplifier and an input terminal of the third power amplifier at a connecting point, and the bias control circuit performs a control process of supplying a bias current to one of the first and second power amplifiers depending on a frequency band selected from the first and second frequency bands.

According to the present invention, it is possible to reduce manufacturing costs of a power amplifier module capable of coping with multiple frequency bands.

DESCRIPTION OF THE PREFERRED EMBODIMENTS

Figure 1:
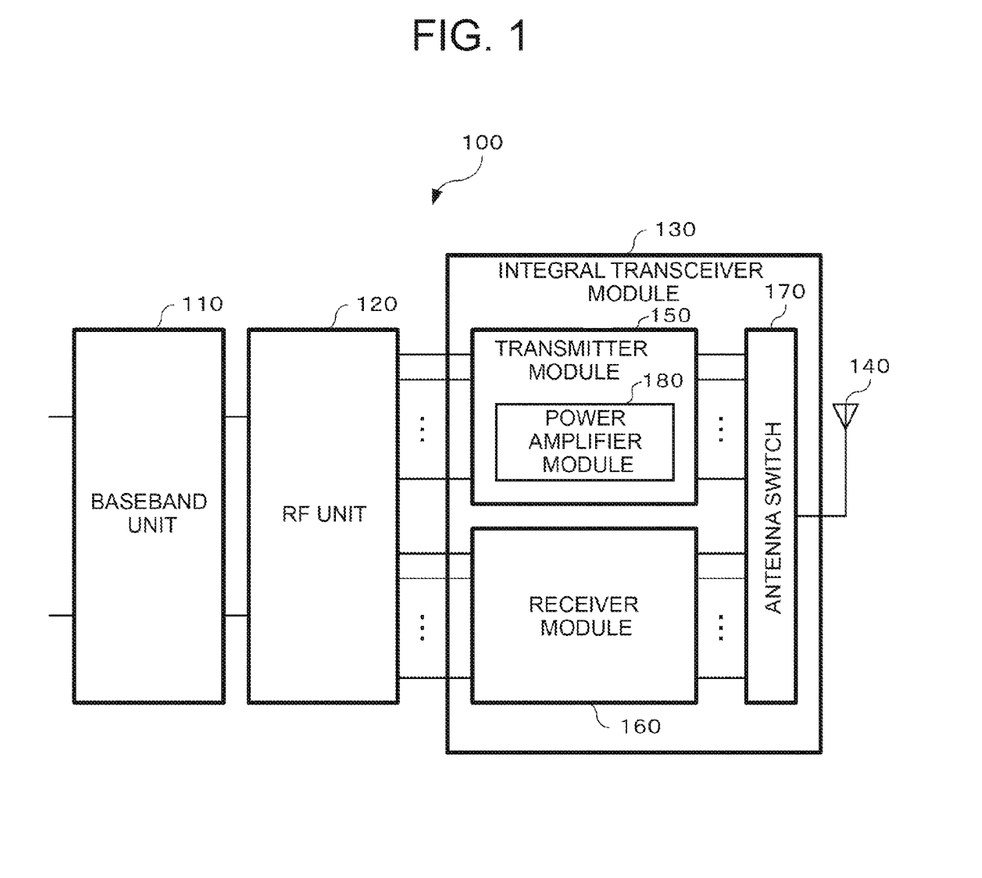
FIG. 1 is a diagram illustrating a configuration example of a communication unit according to an embodiment of the present invention.

Hereinafter, an embodiment of the present invention will be described with reference to the accompanying drawings. FIG. 1 is a diagram illustrating a configuration example of a communication unit according to the embodiment of the present invention. The communication unit 100 is a unit, which is used to transmit and receive an RF signal to and from a base station, in mobile communication equipment such as a mobile phone. As illustrated in FIG. 1, the communication unit 100 includes a baseband unit 110, an RF unit 120, an integrated transceiver module 130, and an antenna 140.

The baseband unit 110 performs digital signal processing on a baseband signal on the basis of a modulation technique such as a high speed uplink packet access (HSUPA) technique or a long term evolution (LTE) technique. When a signal is transmitted to the base station, the baseband unit 110 modulates an input signal on the basis of the modulation technique and outputs a modulated signal to the RF unit 120. When a signal is received from the base station, the baseband unit 110 demodulates a modulated signal received from the RF unit 120 on the basis of the modulation technique.

The RF unit 120 converts a baseband signal into a corresponding RF signal. When a signal is transmitted to a base station, the RF unit 120 converts a baseband signal received from the baseband unit 110 into a corresponding RF signal to be wirelessly transmitted, and outputs the RF signal to the integrated transceiver module 130. When a signal is received from the base station, the RF unit 120 converts an RF signal received from the integrated transceiver module 130 into a corresponding baseband signal, and outputs the baseband signal to the baseband unit 110. The frequency of an RF signal ranges, for example, from several hundred MHz to several GHz. The baseband unit 110 can output RF signals of multiple frequency bands. The frequency band of an RF signal selected by the RF unit 120 is controlled by a control signal from the baseband unit 110.

The integrated transceiver module 130 performs signal processing for transmitting and receiving an RF signal via the antenna 140. As illustrated in FIG. 1, the integrated transceiver module 130 includes a transmitter module 150, a receiver module 160, and an antenna switch 170.

The transmitter module 150 performs signal processing for transmitting an RF signal to a base station. As illustrated in FIG. 1, the transmitter module 150 includes a power amplifier module 180. The transmitter module 150 performs a filtering process depending on the frequency band of the RF signal or performs a process of amplifying the RF signal using the power amplifier module 180.

The receiver module 160 performs a filtering process depending on the frequency band of an RF signal or performs a noise removing process using a low noise amplifier (LNA) on the RF signal received from the base station.

The antenna switch 170 switches a signal path between the transmitter module 150 and the receiver module 160 depending on the frequency band of an RF signal to be transmitted and received.

Figure 2:
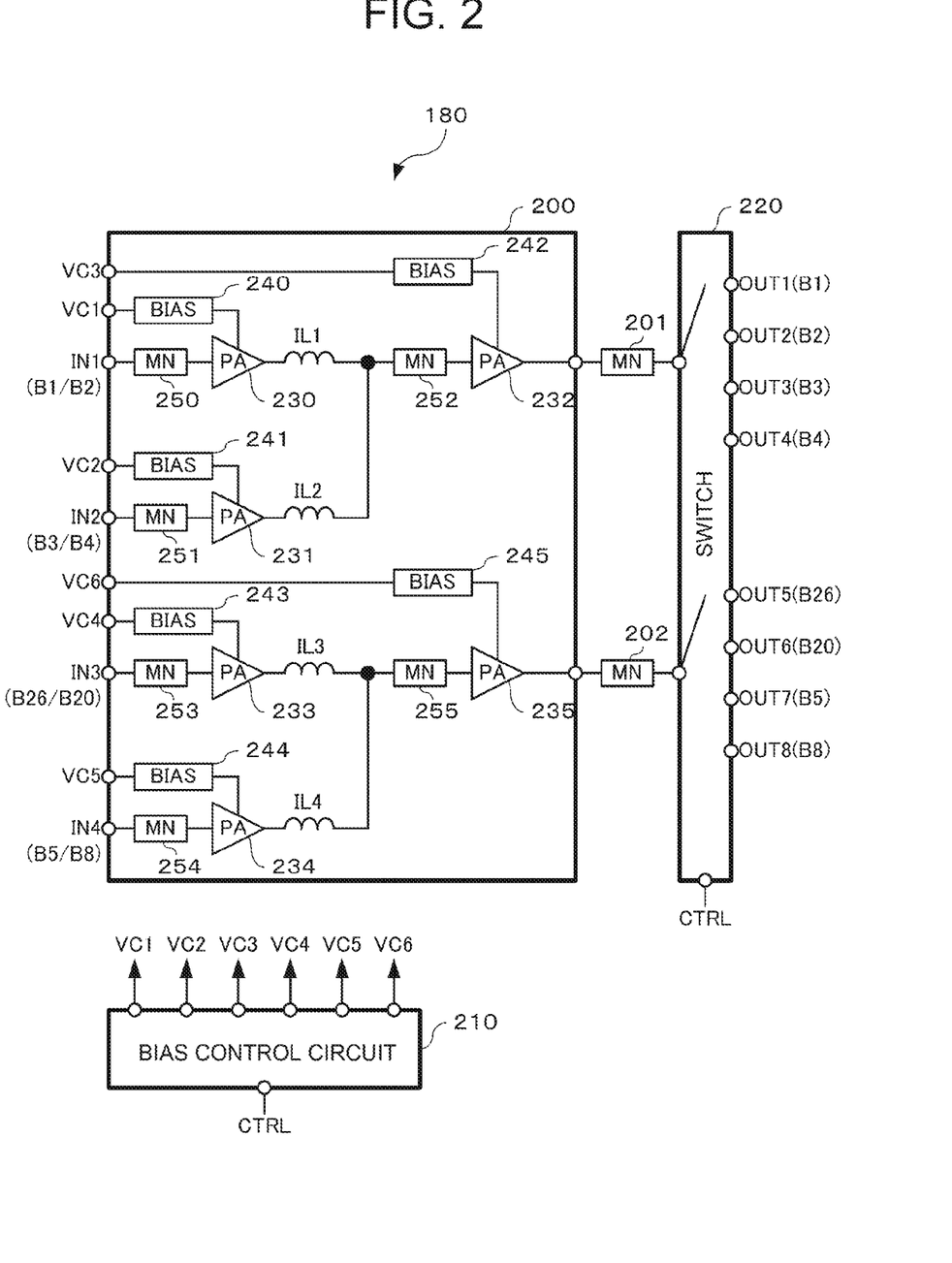
FIG. 2 is a block diagram illustrating a configuration example of a power amplifier module.

FIG. 2 is a block diagram illustrating a configuration example of the power amplifier module 180. As illustrated in FIG. 2, the power amplifier module 180 includes an HBT chip 200, matching networks (MN) 201 and 202, a bias control circuit 210, and a switch 220. The power amplifier module 180 corresponds to multiple frequency bands. In the example illustrated in FIG. 2, the power amplifier module 180 corresponds to eight frequency bands, for example, B1 (1920 MHz to 1980 MHz), B2 (1850 MHz to 1910 MHz), B3 (1710 MHz to 1785 MHz), B4 (1710 MHz to 1755 MHz), B26 (814 MHz to 849 MHz), B20 (832 MHz to 862 MHz), B5 (824 MHz to 849 MHz), and B8 (880 MHz to 915 MHz). In this embodiment, four frequency bands B1, B2, B3, and B4 are referred to as high bands and four frequency bands B26, B20, B5, and B8 are referred to as low bands.

The HBT chip 200 is an integrated circuit for amplifying RF signals of multiple frequency bands and is constituted by HBTs. In this embodiment, a configuration in which an HBT is used as an amplification element for amplifying an RF signal is described, but a transistor other than an HBT may be used to amplify an RF signal. As illustrated in FIG. 2, the HBT chip 200 includes power amplifiers (PA) 230 to 235, bias circuits 240 to 245, matching networks 250 to 255, and inductors IL1 to IL4.

The power amplifiers 230 to 235 are amplifier circuits for amplifying an RF signal. The power amplifiers 230 to 232 are provided for high-band amplification and the power amplifiers 233 to 235 are provided for low-band amplification.

More specifically, the power amplifier 230 (first power amplifier) is a first-stage (drive-stage) power amplifier for amplifying an RF signal of the frequency band of B1 or B2 (first radio frequency signal) input from a terminal IN1 (first signal input terminal). The power amplifier 231 (second power amplifier) is a first-stage (drive-stage) power amplifier for amplifying an RF signal of the frequency band of B3 or B4 (second radio frequency signal) input from a terminal IN2 (second signal input terminal). The power amplifier 232 (third power amplifier) is a second-stage (power-stage) power amplifier for amplifying an RF signal of the frequency band of B1, B2, B3, or B4.

Similarly, the power amplifier 233 (fourth power amplifier) is a first-stage (drive-stage) power amplifier for amplifying an RF signal of the frequency band of B26 or B20 (third radio frequency signal) input from a terminal IN3 (third signal input terminal). The power amplifier 234 (fifth power amplifier) is a first-stage (drive-stage) power amplifier for amplifying an RF signal of the frequency band of B5 or B8 (fourth radio frequency signal) input from a terminal IN4 (fourth signal input terminal). The power amplifier 235 (sixth power amplifier) is a second-stage (power-stage) power amplifier for amplifying an RF signal of the frequency band of B26, B20, B5, or B8.

The bias circuits 240 to 245 supply bias currents to the power amplifiers 230 to 235 on the basis of bias control voltages VC1 to VC6 supplied from the bias control circuit 210. For example, the bias circuit 240 supplies a bias current to the power amplifier 230 when the bias control voltage VC1 is at a high level, and does not generate a bias current when the bias control voltage VC1 is at a low level. The bias circuits 241 to 245 operate in the same way.

In this embodiment, the bias control voltages VC1 to VC6 are controlled depending on the frequency band selected as a transmission target. Specifically, for example, when the selected frequency band is B1, the bias control voltages VC1 and VC3 are controlled so as to be at a high level and the bias control voltage VC2 is controlled so as to be at a low level. In this case, since a bias current is not supplied from the bias circuit 241, the power amplifier 231 is turned off. Accordingly, the output of the power amplifier 231 is changed to high impedance and the RF signal from the power amplifier 230 is input to the power amplifier 232. For example, when the selected frequency band is B3, the bias control voltages VC2 and VC3 are controlled so as to be at a high level and the bias control voltage VC1 is controlled so as to be at a low level. In this case, since a bias current is not supplied from the bias circuit 240, the power amplifier 230 is turned off. Accordingly, the output of the power amplifier 230 is changed to high impedance and the RF signal from the power amplifier 231 is input to the power amplifier 232. The same is true of the low band side. In this way, in the HBT chip 200, it is possible to cope with multiple frequency bands without switching signals input to the power amplifiers using a switch.

The matching networks 250 to 255 are circuits for matching front and rear circuits in impedance and are constituted using capacitors or inductors.

The inductors IL1 to IL4 are provided to improve isolation between the power amplifiers of which the output terminals are electrically connected to each other and to facilitate the matching of impedance. Specifically, the inductor IL1 (first inductor) and the inductor IL2 (second inductor) are provided to improve isolation between the power amplifiers 230 and 231 and to facilitate the matching of impedance between the drive stage and the power stage. Similarly, the inductors IL3 and IL4 are provided to improve isolation between the power amplifiers 233 and 234 and to facilitate the matching of impedance between the drive stage and the power stage. The inductance of the inductor IL2 can be set to be greater than the inductance of the inductor IL1. This is because the RF signal (B1 or B2) output from the power amplifier 230 side has a higher frequency than the RF signal (B3 or B4) output from the power amplifier 231 and the higher the target frequency of the impedance matching becomes, the smaller the necessary inductance becomes. The same is true of the inductors IL3 and IL4.

The bias control circuit 210 controls the levels of the bias control voltage VC1 to VC6 on the basis of a control signal CTRL for selecting a frequency band. The bias control circuit 210 is constituted, for example, by FETs. Specifically, for example, when B1 or B2 is selected, the bias control circuit 210 sets the bias control voltages VC1 and VC3 to a high level and sets the other bias control voltages to a low level. For example, when B3 or B4 is selected, the bias control circuit 210 sets the bias control voltages VC2 and VC3 to a high level and sets the other bias control voltages to a low level. For example, when B26 or B20 is selected, the bias control circuit 210 sets the bias control voltages VC4 and VC6 to a high level and sets the other bias control voltages to a low level. For example, when B5 or B8 is selected, the bias control circuit 210 sets the bias control voltages VC5 and VC6 to a high level and sets the other bias control voltages to a low level.

The switch 220 outputs the RF signal output from the power amplifier 232 or the power amplifier 235 to the output terminal of the selected frequency band on the basis of the control signal CTRL for selecting a frequency band. In the configuration illustrated in FIG. 2, output terminals are provided to correspond to the frequency bands, but a single output terminal may be shared by several frequency bands.

Figure 3:
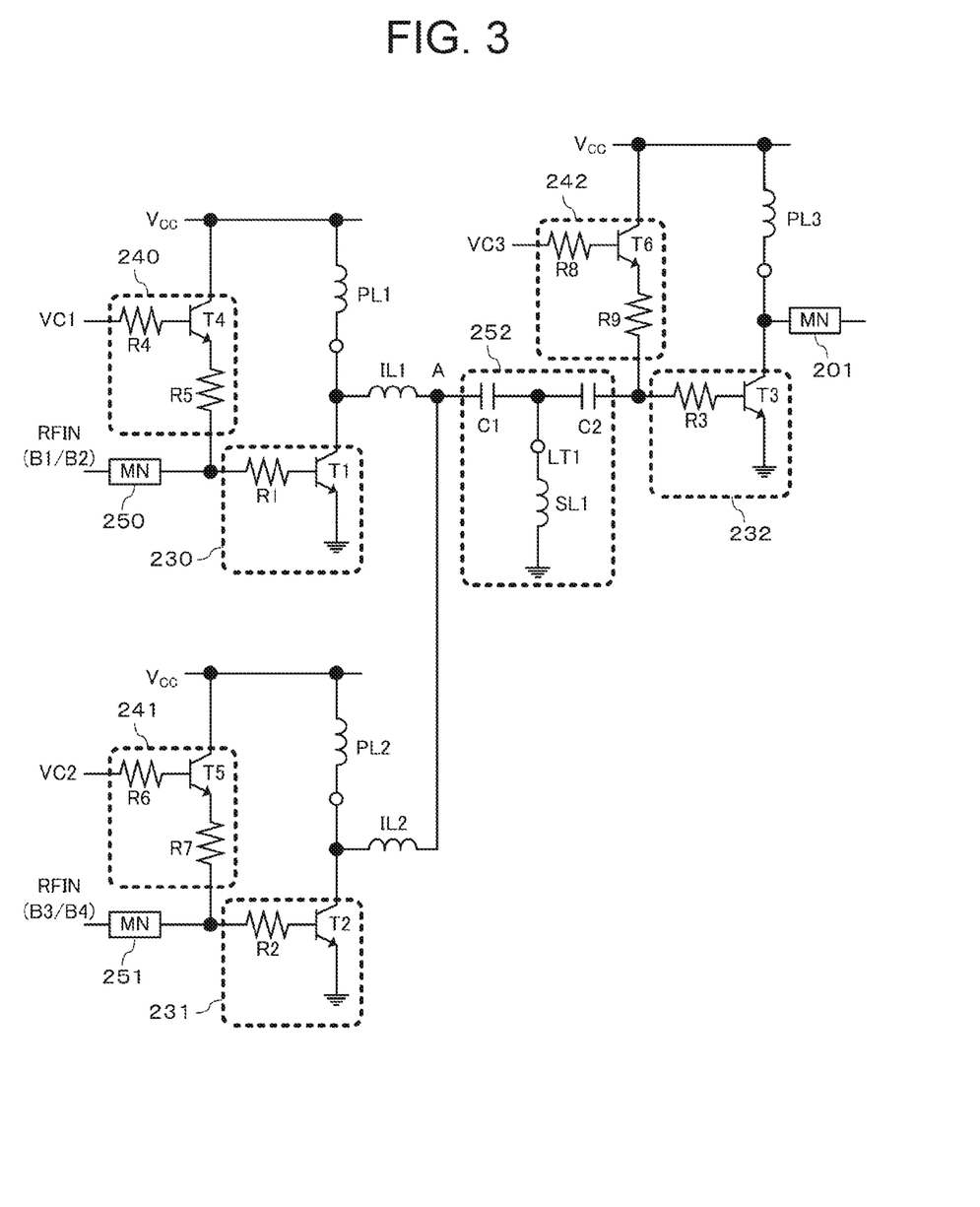
FIG. 3 is a diagram illustrating a partial configuration example of a power amplifier module.

FIG. 3 is a diagram illustrating a partial configuration example of the power amplifier module 180. Specifically, FIG. 3 illustrates a configuration example of the power amplifiers 230 to 232, the bias circuits 240 to 242, and the matching network 252 which are circuits on the high band side. Although not illustrated in FIG. 3, the circuits on the low band side can be configured in the same way.

The power amplifier 230 includes a transistor T1 and a resistor R1. In the transistor T1, the collector is supplied with a source voltage VCC via an inductor PL1, the base is supplied with an RF signal of the frequency band B1 or B2 via the resistor R1, and the emitter is grounded (common-emitter circuit). The transistor T1 amplifies the RF signal input to the emitter and outputs the amplifier RF signal from the collector. The amplified signal from the transistor T1 is output to the power-stage power amplifier 232 via the inductor IL1 and the matching network 252.

The power amplifier 231 includes a transistor T2 and a resistor R2. In the transistor T2, the collector is supplied with the source voltage VCC via an inductor PL2, the base is supplied with an RF signal of the frequency band B3 or B4 via the resistor R2, and the emitter is grounded (common-emitter circuit). The transistor T2 amplifies the RF signal input to the emitter and outputs the amplifier RF signal from the collector. The amplified signal from the transistor T2 is output to the power-stage power amplifier 232 via the inductor IL2 and the matching network 252.

The power amplifier 232 includes a transistor T3 and a resistor R3. In the transistor T3, the collector is supplied with the source voltage VCC via an inductor PL3, the base is supplied with the RF signal from the power amplifier 230 or 231 via the resistor R3, and the emitter is grounded (common-emitter circuit). The transistor T3 amplifies the RF signal input to the emitter and outputs the amplifier RF signal from the collector. The amplified signal from the transistor T3 is output via a matching network 201.

The bias circuit 240 includes a transistor T4 and resistors R4 and R5. In the transistor T4, the collector is supplied with the source voltage VCC, the base is supplied with the bias control voltage VC1 via the resistor R4, and the emitter is connected to the input of the power amplifier 230 via the resistor R5. For example, when the bias control voltage VC1 is at a high level, the transistor T4 is turned on and a bias current is supplied to the power amplifier 230. On the other hand, when the bias control voltage VC1 is at a low level, the transistor T4 is turned off and a bias current is not supplied to the power amplifier 230.

The bias circuit 241 includes a transistor T5 and resistors R6 and R7. In the transistor T5, the collector is supplied with the source voltage VCC, the base is supplied with the bias control voltage VC2 via the resistor R6, and the emitter is connected to the input of the power amplifier 231 via the resistor R7. For example, when the bias control voltage VC2 is at a high level, the transistor T5 is turned on and a bias current is supplied to the power amplifier 231. On the other hand, when the bias control voltage VC2 is at a low level, the transistor T5 is turned off and a bias current is not supplied to the power amplifier 231.

The bias circuit 242 includes a transistor T6 and resistors R8 and R9. In the transistor T6, the collector is supplied with the source voltage VCC, the base is supplied with the bias control voltage VC3 via the resistor R8, and the emitter is connected to the input of the power amplifier 232 via the resistor R9. For example, when the bias control voltage VC3 is at a high level, the transistor T6 is turned on and a bias current is supplied to the power amplifier 232. On the other hand, when the bias control voltage VC3 is at a low level, the transistor T6 is turned off and a bias current is not supplied to the power amplifier 232.

The matching network 252 includes capacitors C1 and C2 and an inductor SL1. The capacitors C1 and C2 are connected in series. The inductor SL1 (third inductor) is shunt-connected between the capacitors C1 and C2 via the terminal LT1 (shut connection terminal).

Figure 4A:
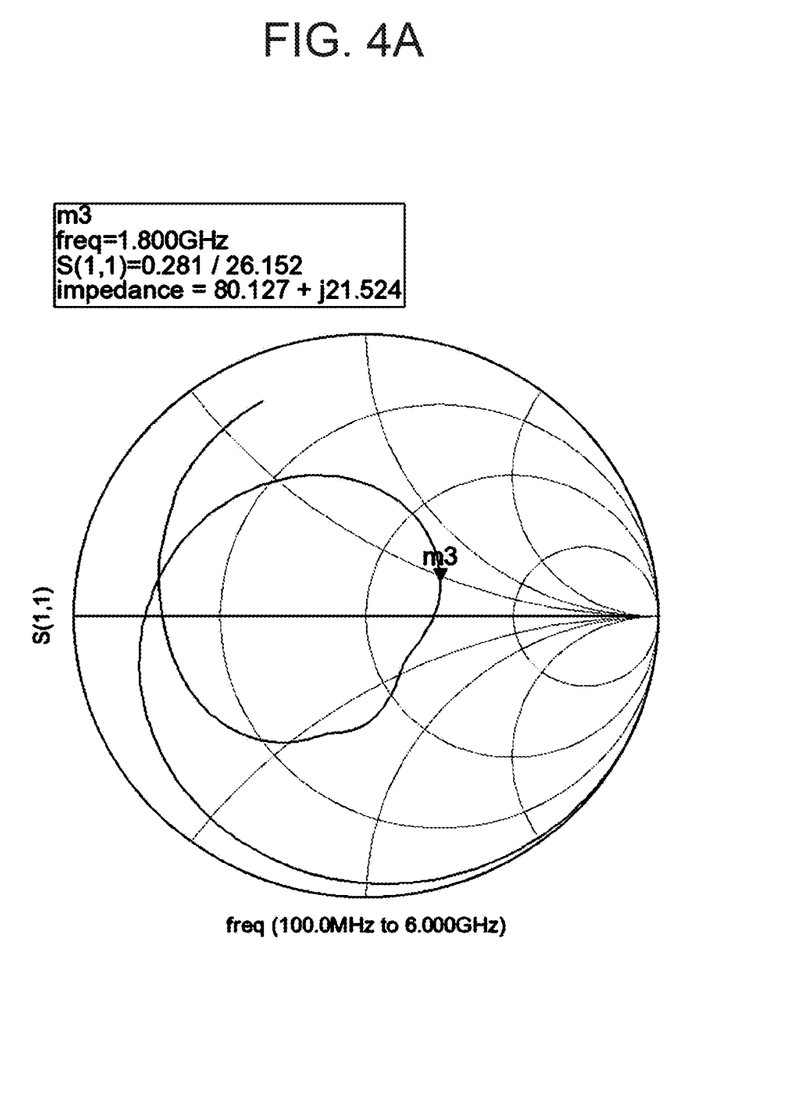
FIG. 4A is a diagram illustrating a simulation result of an example of impedance of a drive-stage power amplifier side when a bias control voltage is at a high level and when viewed from a connecting point (e.g., point A in FIG. 3) of the drive-stage power amplifier and a power-stage power amplifier.
Figure 4B:
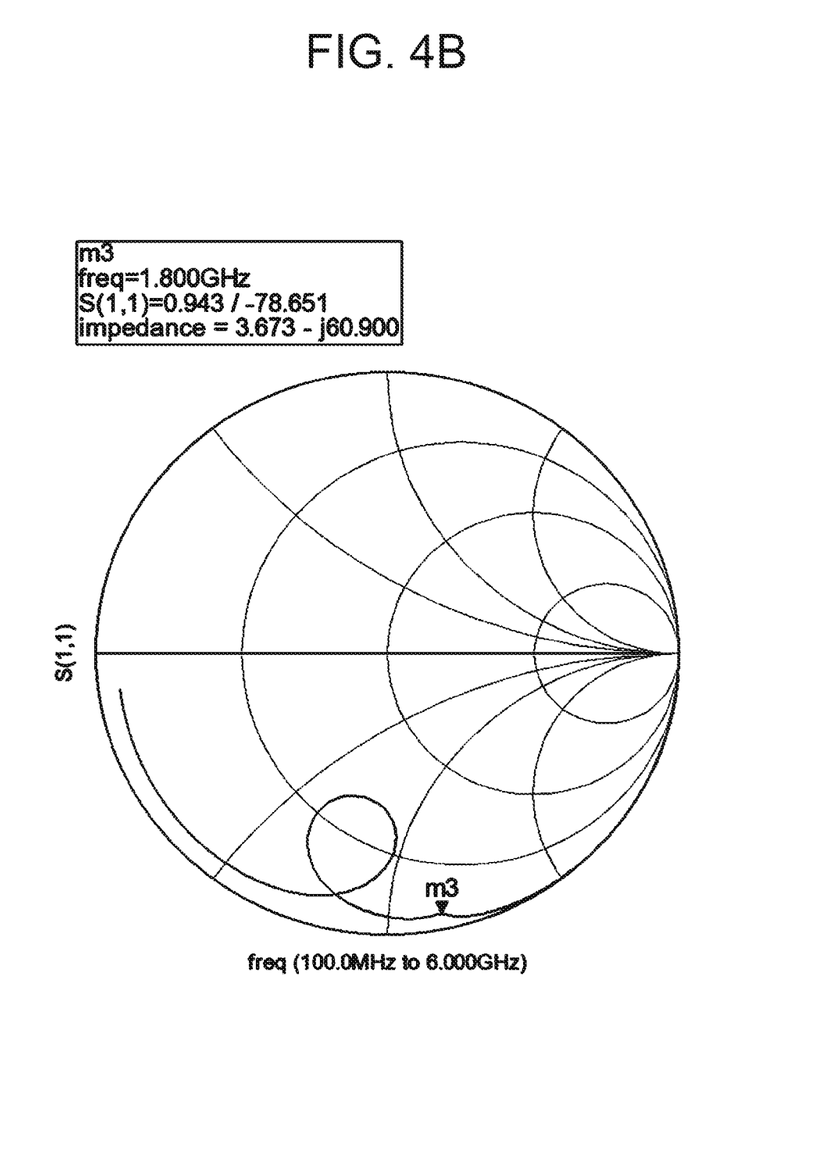
FIG. 4B is a diagram illustrating a simulation result of an example of impedance of a power amplifier side when a bias control voltage is at a low level and when viewed from a connecting point (e.g., point A in FIG. 3) of the drive-stage power amplifier and a power-stage power amplifier.

FIGS. 4A and 4B are diagrams illustrating simulation results of an example of impedance of the drive-stage power amplifier 231 side when viewed from the connecting point (point A in FIG. 3) of the drive-stage power amplifiers 230 and 231 and a power-stage power amplifier 322. FIG. 4A illustrates a case in which the bias control voltage VC2 is at a high level and FIG. 4B illustrates a case in which the bias control voltage VC2 is at a low level.

When the bias control voltage VC2 is at a high level, the bias circuit 241 is turned on, a bias current is supplied to the power amplifier 231, and the power amplifier 231 is turned on. In this case, as illustrated in FIG. 4A, the impedance of the power amplifier 231 side when viewed from point A is relatively small. On the other hand, when the bias control voltage VC2 is at a low level, the bias circuit 241 is turned off, a bias current is not supplied to the power amplifier 231, and the power amplifier 231 is turned off. In this case, as illustrated in FIG. 4B, the impedance of the power amplifier 231 side when viewed from point A is relatively great.

In this way, when the frequency band B1 or B2 is selected, the bias control voltage VC2 is set to a low level, whereby the bias circuit 241 and the power amplifier 231 are turned off and the power amplifier 231 side from point A can be set to high impedance. Accordingly, it is possible to select a signal path of the RF signal of the frequency band B1 or B2 without using a switch. As for the other frequency bands, similarly, it is possible to select a signal path of an RF signal without using a switch, by controlling the bias control voltages VC1 to VC6.

Figure 5:
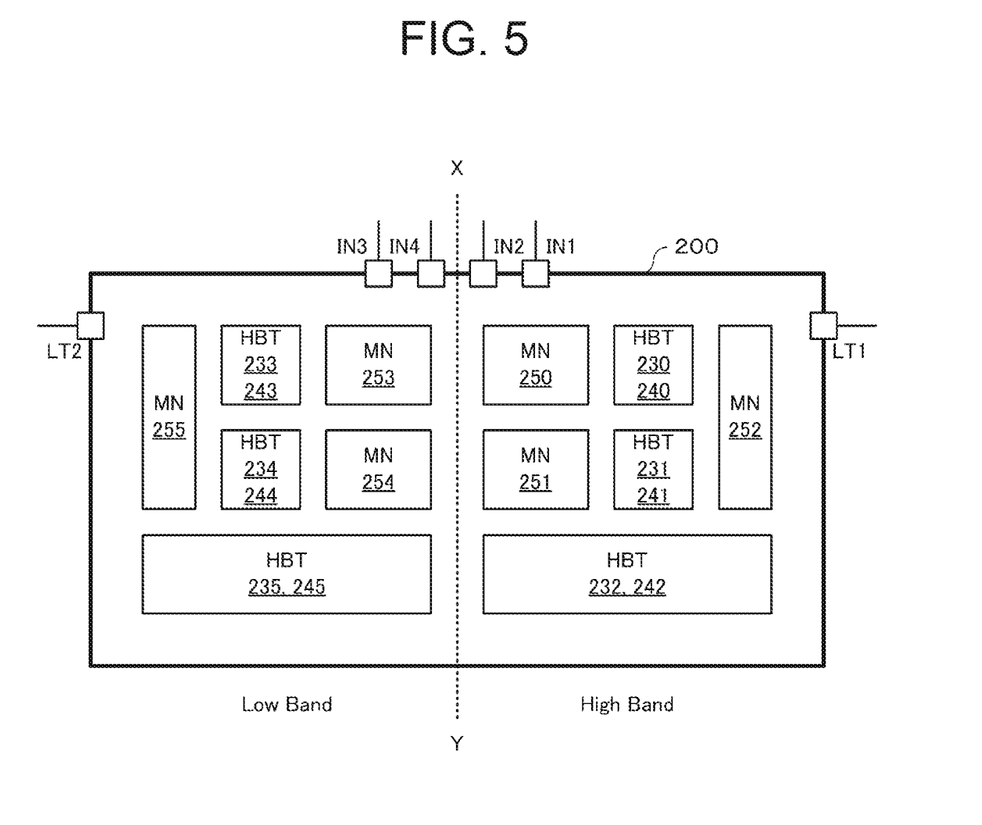
FIG. 5 is a diagram illustrating a layout example of an HBT chip.

FIG. 5 is a diagram illustrating a layout example of the HBT chip 200. In FIG. 5, only elements associated with the description herein are illustrated. That is, in FIG. 5, all of the elements of the HBT chip 200 are not illustrated. For example, six terminals N1 to IN4, LT1, and LT2 are illustrated in FIG. 5, but other terminals are present in the HBT chip 200.

As illustrated in FIG. 5, high-band circuits are arranged on the right side of the dotted line X-Y. Specifically, on the right side of the dotted line X-Y, an HBT of the power amplifier 230 and the bias circuit 240, an HBT of the power amplifier 231 and the bias circuit 241, an HBT of the power amplifier 232 and the bias circuit 242, and the matching networks 250 to 252 are arranged as the high-band circuits. On the left side of the dotted line X-Y, an HBT of the power amplifier 233 and the bias circuit 243, an HBT of the power amplifier 234 and the bias circuit 244, an HBT of the power amplifier 235 and the bias circuit 245, and the matching networks 253 to 255 are arranged as the low-band circuits. In this way, in the HBT chip 200, the high-band circuits and the low-band circuits are arranged so as to be substantially axisymmetric about the dotted line X-Y. Accordingly, it is possible to efficiently arrange circuits in the HBT chip 200 and thus to reduce the chip area.

As illustrated in FIG. 5, in the high-band circuits, the input terminals IN1 and IN2 of an RF signal are disposed on the top side in FIG. 5 and the terminal LT1 for connection to the inductor SL1 of the matching network 252 is disposed on the right side in FIG. 5. In this way, by forming the input terminals IN1 and IN2 and the terminal LT1 on the neighboring sides, not the same or opposite side, directions of wires (bonding wire) connected to the input terminals IN1 and IN2 and a direction of a wire (bonding wire) connected to the terminal LT1 can be made to be perpendicular to each other. Accordingly, it is possible to suppress coupling between the wires connected to the input terminals N1 and IN2 and the wire connected to the terminal LT1. As illustrated in FIG. 5, by setting the distance between the input terminals IN1 and IN2 and the terminal LT1 to be relatively great, it is possible to enhance a coupling suppression effect between the wires. In the low-band circuits, the same is true of the input terminals IN3 and IN4 and the terminal LT2. The terminal LT2 is a terminal for connection to the inductor shunt-connected in the matching network 255.

Figure 6A:
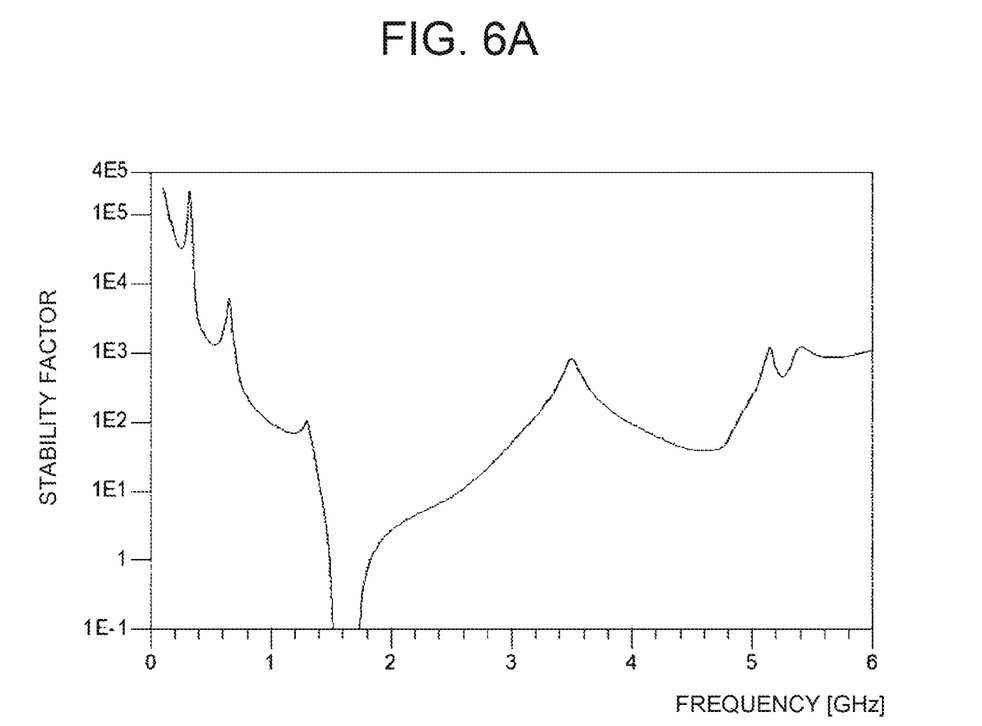
FIG. 6A is a diagram illustrating a simulation result of an example of a stability factor K in a power amplifier module in consideration of a coupling effect between both wires when bonding wires of an input terminal portion of RF signals and a terminal shunt-connected to an inductor using a bonding wire are formed on the same side of an HBT chip.
Figure 6B:
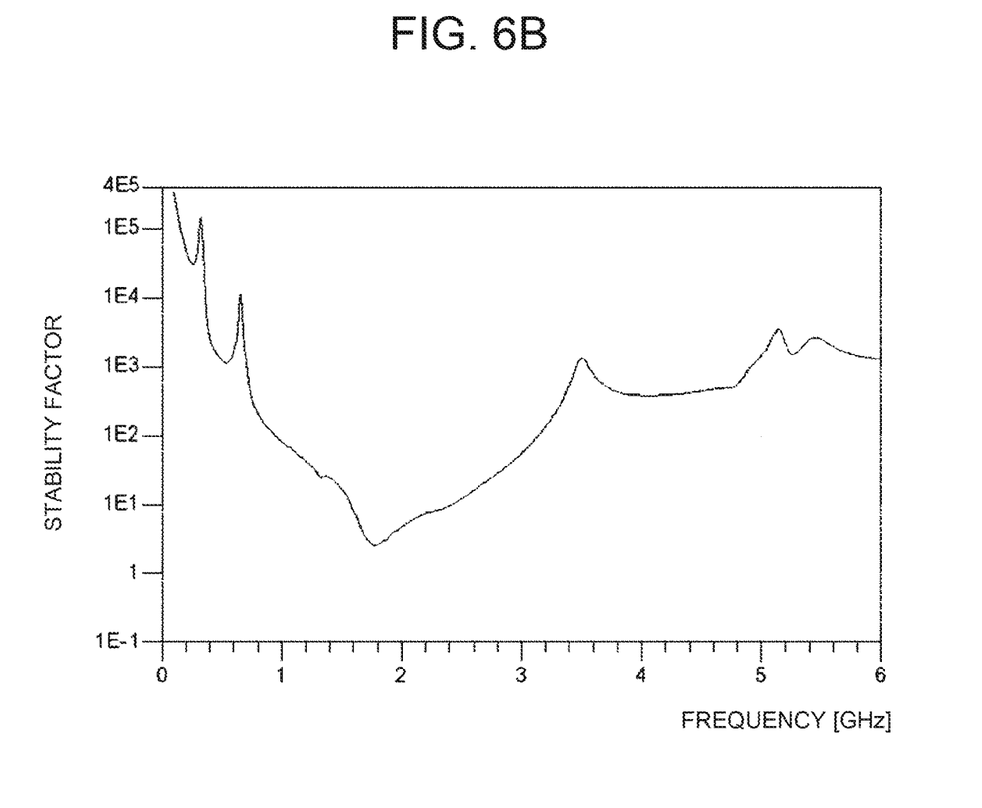
FIG. 6B is a diagram illustrating a simulation result of an example of a stability factor K in a power amplifier module in consideration of a coupling effect between both wires when the bonding wires of an input terminal portion of RF signals and a terminal shunt-connected to an inductor using a bonding wire are formed in the same way as illustrated in FIG. 5.

FIGS. 6A and 6B are diagrams illustrating simulation results of an example of a stability factor K in the power amplifier module 180. In FIGS. 6A and 6B, the horizontal axis represents the frequency (GHz) and the vertical axis represents the stability factor. FIG. 6A illustrates the simulation result of an example of the stability factor K in the power amplifier module 180 in consideration of a coupling effect between the bonding wires of the input terminal portion of RF signals and the terminal shunt-connected to the inductor using the bonding wire when both wires are formed on the same side of the HBT chip 200. FIG. 6B illustrates the simulation result of an example of the stability factor K in the power amplifier module 180 in consideration of the coupling effect between both wires when the bonding wires of the input terminal portion of RF signals and the terminal shunt-connected to the inductor using the bonding wire are formed in the same way as illustrated in FIG. 5.

As illustrated in FIG. 6A, when the input terminals of RF signals and the terminal shunt-connected to the inductor are formed on the same side of the HBT chip 200, the stability factor is less than 1 in the vicinity of 1.5 GHz to 1.8 GHz. In this way, when the stability factor is less than 1, the operation of the power amplifier module 180 is destabilized. On the other hand, as illustrated in FIG. 6B, when the input terminals of RF signals and the terminal shunt-connected to the inductor are formed in the same way as illustrated in FIG. 5, the stability factor is equal to or greater than 1 in all of the frequency bands subjected to the simulation. From these simulation results, it can be seen that the coupling is suppressed and the stability of the operation of the power amplifier module 180 is improved, by forming the input terminals of RF signals and the terminal shunt-connected to the inductor in the same way as illustrated in FIG. 5.

Hitherto, an embodiment of the present invention has been described. A power amplifier module 180 according to this embodiment can select a signal path of an RF signal without using a switch formed of an FET, by controlling generation of a bias current in the drive-stage bias circuits. Accordingly, it is possible to reduce the manufacturing costs of the power amplifier module capable of coping with multiple frequency bands. Compared with a case in which a switch formed of an FET is formed on a chip other than the HBT chip, it is possible to reduce connection between chips and thus to reduce signal transmission loss.

According to this embodiment, it is possible to improve isolation between the power amplifiers of which the output terminals are electrically connected, by providing the isolation inductors IL1 to IL4 to the outputs of the drive-stage power amplifiers 230, 231, 233, and 234. In this embodiment, only the configuration in which the isolation inductors IL1 to IL4 are provided is described above, but a configuration in which the inductors IL1 to IL4 are not provided may be employed.

According to this embodiment, by forming the input terminals of RF signals and the terminal shunt-connected to the inductor on the neighboring sides of the HBT chip 200, it is possible to suppress the coupling and to improve the stability of the operation of the power amplifier module 180.

According to this embodiment, by arranging the high-band circuits and the low-band circuits so as to be substantially axisymmetric, it is possible to reduce the chip area.

This embodiment is provided for easily understanding the present invention, but not provided for limiting the present invention. The present invention can be modified/improved without departing from the gist thereof and the present invention includes equivalents thereof.

REFERENCE SIGNS LIST

100: communication unit
110: baseband unit
120: RF unit
130: integrated transceiver module
140: antenna
150: transmitter module
160: receiver module
170: antenna switch
180: power amplifier module
200: HBT chip
201, 202, 250~255: matching network
210: bias control circuit
220: switch
230~235: power amplifier
240~245: bias circuit

What is claimed is:
1. A power amplifier module comprising:
a first signal input terminal to which a first radio frequency signal of a first frequency band is input;
a second signal input terminal to which a second radio frequency signal of a second frequency band is input;
first, second, and third power amplifiers;
a bias control circuit;
a shunt connection terminal that is electrically connected between an output terminal of the first power amplifier, an output terminal of the second power amplifier, and an input terminal of the third power amplifier; and
a third inductor of which a first end is electrically connected to the shunt connection terminal and a second end is grounded,
wherein the first signal input terminal and an input terminal of the first power amplifier are electrically connected to each other,
wherein the second signal input terminal and an input terminal of the second power amplifier are electrically connected to each other,
wherein the output terminal of the first power amplifier is electrically connected to the output terminal of the sec- ond power amplifier and the input terminal of the third power amplifier at a connecting point, wherein the bias control circuit performs a control process of supplying a bias current to one of the first and second power amplifiers depending on a frequency band selected from the first and second frequency bands, wherein the first and second signal input terminals are formed on a first side of a semiconductor integrated circuit, wherein the shunt connection terminal is formed on a second side of the semiconductor integrated circuit, the second side of the semiconductor integrated circuit being adjacent to the first side of the semiconductor integrated circuit, and wherein a direction of wires connected to the first and second signal input terminals and a direction of a wire connected to the shunt connection terminal are perpendicular to each other.

2. The power amplifier module according to claim 1, further comprising:

a first inductor that is disposed between the connecting point and the output terminal of the first power amplifier; and a second inductor that is disposed between the connecting point and the output terminal of the second power amplifier.

3. The power amplifier module according to claim 2, wherein the first frequency band is a frequency band higher than the second frequency band, and wherein the inductance of the second inductor is greater than the inductance of the first inductor.

4. The power amplifier module according to claim 2, further comprising:

a shunt connection terminal that is electrically connected between the output terminal of the first power amplifier, the output terminal of the second power amplifier, and the input terminal of the third power amplifier; and a third inductor of which a first end is electrically connected to the shunt connection terminal and a second end is grounded, wherein the first and second signal input terminals are formed on a first side of a semiconductor integrated circuit, wherein the shunt connection terminal is formed on a second side of the semiconductor integrated circuit, the second side of the semiconductor integrated circuit being adjacent to the first side of the semiconductor integrated circuit, and wherein a direction of a wire connected to the first signal input terminal and a direction of a wire connected to the second signal input terminal are perpendicular to each other.

5. The power amplifier module according to claim 3, further comprising:

a shunt connection terminal that is electrically connected between the output terminal of the first power amplifier, the output terminal of the second power amplifier, and the input terminal of the third power amplifier; and a third inductor of which a first end is electrically connected to the shunt connection terminal and a second end is grounded, wherein the first and second signal input terminals are formed on a first side of a semiconductor integrated circuit, wherein the shunt connection terminal is formed on a second side of the semiconductor integrated circuit, the second side of the semiconductor integrated circuit being adjacent to the first side of the semiconductor integrated circuit, and wherein a direction of a wire connected to the first signal input terminal and a direction of a wire connected to the second signal input terminal are perpendicular to each other.

6. The power amplifier module according to claim 1, further comprising:

a third signal input terminal to which a third radio frequency signal of a third frequency band is input;

a fourth signal input terminal to which a fourth radio frequency signal of a fourth frequency band is input; and fourth, fifth, and sixth power amplifiers, wherein the third signal input terminal and an input terminal of the fourth power amplifier are electrically connected to each other, wherein the fourth signal input terminal and an input terminal of the fifth power amplifier are electrically connected to each other, wherein output terminals of the fourth and fifth power amplifiers and an input terminal of the sixth power amplifier are electrically connected to each other, wherein the bias control circuit performs a control process of supplying a bias current to one of the first, second, third, and fourth power amplifiers depending on the frequency band selected from the first, second, third, and fourth frequency bands, and wherein the first, second, and third power amplifiers and the fourth, fifth, and sixth power amplifiers are arranged on a semiconductor integrated circuit so as to be substantially axisymmetric.

7. The power amplifier module according to claim 2, further comprising:

a third signal input terminal to which a third radio frequency signal of a third frequency band is input;

a fourth signal input terminal to which a fourth radio frequency signal of a fourth frequency band is input; and fourth, fifth, and sixth power amplifiers, wherein the third signal input terminal and an input terminal of the fourth power amplifier are electrically connected to each other, wherein the fourth signal input terminal and an input terminal of the fifth power amplifier are electrically connected to each other, wherein output terminals of the fourth and fifth power amplifiers and an input terminal of the sixth power amplifier are electrically connected to each other, wherein the bias control circuit performs a control process of supplying a bias current to one of the first, second, third, and fourth power amplifiers depending on the frequency band selected from the first, second, third, and fourth frequency bands, and wherein the first, second, and third power amplifiers and the fourth, fifth, and sixth power amplifiers are arranged on a semiconductor integrated circuit so as to be substantially axisymmetric.

8. The power amplifier module according to claim 3, further comprising:

a third signal input terminal to which a third radio frequency signal of a third frequency band is input;

a fourth signal input terminal to which a fourth radio frequency signal of a fourth frequency band is input; and fourth, fifth, and sixth power amplifiers, wherein the third signal input terminal and an input terminal of the fourth power amplifier are electrically connected to each other, wherein the fourth signal input terminal and an input terminal of the fifth power amplifier are electrically connected to each other,
wherein output terminals of the fourth and fifth power amplifiers and an input terminal of the sixth power amplifier are electrically connected to each other,
wherein the bias control circuit performs a control process of supplying a bias current to one of the first, second, third, and fourth power amplifiers depending on the frequency band selected from the first, second, third, and fourth frequency bands, and
wherein the first, second, and third power amplifiers and the fourth, fifth, and sixth power amplifiers are arranged on a semiconductor integrated circuit so as to be substantially axisymmetric.

9. The power amplifier module according to claim 1, further comprising:
a third signal input terminal to which a third radio frequency signal of a third frequency band is input;
a fourth signal input terminal to which a fourth radio frequency signal of a fourth frequency band is input; and
fourth, fifth, and sixth power amplifiers,
wherein the third signal input terminal and an input terminal of the fourth power amplifier are electrically connected to each other,
wherein the fourth signal input terminal and an input terminal of the fifth power amplifier are electrically connected to each other,
wherein output terminals of the fourth and fifth power amplifiers and an input terminal of the sixth power amplifier are electrically connected to each other,
wherein the bias control circuit performs a control process of supplying a bias current to one of the first, second, third, and fourth power amplifiers depending on the frequency band selected from the first, second, third, and fourth frequency bands, and
wherein the first, second, and third power amplifiers and the fourth, fifth, and sixth power amplifiers are arranged on the semiconductor integrated circuit so as to be substantially axisymmetric.

10. An integrated transceiver module comprising:
a transmitter module that includes the power amplifier module that transmits a radio frequency signal via an antenna, the power amplifier module comprising:
a first signal input terminal to which a first radio frequency signal of a first frequency band is input;
a second signal input terminal to which a second radio frequency signal of a second frequency band is input;
first, second, and third power amplifiers;
a bias control circuit;
a shunt connection terminal that is electrically connected between an output terminal of the first power amplifier, an output terminal of the second power amplifier, and an input terminal of the third power amplifier; and
a third inductor of which a first end is electrically connected to the shunt connection terminal and a second end is grounded,
wherein the first signal input terminal and an input terminal of the first power amplifier are electrically connected to each other,
wherein the second signal input terminal and an input terminal of the second power amplifier are electrically connected to each other,
wherein the output terminal of the first power amplifier is electrically connected to the output terminal of the second power amplifier and the input terminal of the third power amplifier at a connecting point,
wherein the bias control circuit performs a control process of supplying a bias current to one of the first and second power amplifiers depending on a frequency band selected from the first and second frequency bands,
wherein the first and second signal input terminals are formed on a first side of a semiconductor integrated circuit,
wherein the shunt connection terminal is formed on a second side of the semiconductor integrated circuit, the second side of the semiconductor integrated circuit being adjacent to the first side of the semiconductor integrated circuit, and
wherein a direction of wires connected to the first and second signal input terminals and a direction of a wire connected to the shunt connection terminal are perpendicular to each other; and
a receiver module that receives a radio frequency signal via the antenna.

11. An integrated transceiver module according to claim 10, the power amplifier module further comprising:
a first inductor that is disposed between the connecting point and the output terminal of the first power amplifier; and
a second inductor that is disposed between the connecting point and the output terminal of the second power amplifier.

12. An integrated transceiver module according to claim 10,
wherein the first frequency band is a frequency band higher than the second frequency band, and
wherein the inductance of the second inductor is greater than the inductance of the first inductor.

13. An integrated transceiver module according to claim 10, the power amplifier module further comprising:
a shunt connection terminal that is electrically connected between the output terminal of the first power amplifier, the output terminal of the second power amplifier, and the input terminal of the third power amplifier; and
a third inductor of which a first end is electrically connected to the shunt connection terminal and a second end is grounded,
wherein the first and second signal input terminals are formed on a first side of a semiconductor integrated circuit,
wherein the shunt connection terminal is formed on a second side of the semiconductor integrated circuit, the second side of the semiconductor integrated circuit being adjacent to the first side of the semiconductor integrated circuit, and
wherein a direction of a wire connected to the first signal input terminal and a direction of a wire connected to the second signal input terminal are perpendicular to each other.

14. An integrated transceiver module according to claim 10, the power amplifier module further comprising:
a third signal input terminal to which a third radio frequency signal of a third frequency band is input;
a fourth signal input terminal to which a fourth radio frequency signal of a fourth frequency band is input; and
fourth, fifth, and sixth power amplifiers,
wherein the third signal input terminal and an input terminal of the fourth power amplifier are electrically connected to each other, wherein the fourth signal input terminal and an input terminal of the fifth power amplifier are electrically connected to each other,
wherein output terminals of the fourth and fifth power amplifiers and an input terminal of the sixth power amplifier are electrically connected to each other,
wherein the bias control circuit performs a control process of supplying a bias current to one of the first, second, third, and fourth power amplifiers depending on the frequency band selected from the first, second, third, and fourth frequency bands, and
wherein the first, second, and third power amplifiers and the fourth, fifth, and sixth power amplifiers are arranged on a semiconductor integrated circuit so as to be substantially axisymmetric.

* * * * *